(12) United States Patent
Grinchuk

(10) Patent No.: US 7,218,138 B2
(45) Date of Patent: May 15, 2007

(54) EFFICIENT IMPLEMENTATIONS OF THE THRESHOLD-2 FUNCTION

(75) Inventor: Mikhail I. Grinchuk, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 194 days.

(21) Appl. No.: 11/022,387

(22) Filed: Dec. 23, 2004

(65) Prior Publication Data

US 2006/0143257 A1 Jun. 29, 2006

(51) Int. Cl.
*H03K 19/173* (2006.01)
(52) U.S. Cl. .......................................... 326/38; 326/93
(58) Field of Classification Search ................ 326/37, 326/38, 93
See application file for complete search history.

(56) References Cited

U.S. PATENT DOCUMENTS 3,603,776 A * 9/1971 Weinberger ................ 708/706
5,500,609 A * 3/1996 Kean ............................ 326/41
5,982,194 A * 11/1999 Worrell ........................ 326/41
7,042,246 B2 * 5/2006 Talwar et al. .................. 326/35
2002/0078110 A1 6/2002 Rumynin et al. ........... 708/210

* cited by examiner

*Primary Examiner*—Don Le
(74) *Attorney, Agent, or Firm*—Christopher P. Maiorana

(57) ABSTRACT

A circuit and a method for operating the circuit are disclosed. A first step of the method generally comprises generating a plurality of first intermediate signals in two parallel first operations each responsive to a respective half of a plurality of input signals. A second step involves generating a plurality of result signals in a plurality of first logical operations each responsive to at most two of the first intermediate signals. A third step includes generating a first output signal as a particular one of the result signals, wherein a first delay from the first intermediate signals to the first output signal is at most through one logical gate. A fourth step of the method generally comprises generating a second output signal for a second threshold function in a logical OR operation of the result signals except for the particular one result signal.

22 Claims, 15 Drawing Sheets

(1) $T_2(X_1, \ldots, X_N) = 1$  IF $X_1 + \ldots + X_N \geq 2$
    $\phantom{T_2(X_1, \ldots, X_N)} = 0$  OTHERWISE (2) $T_2(X_1, \ldots, X_N) = OR_{i,j:\ 1 \leq i < j \leq N} (X_i \text{ AND } X_j)$ (3) $T_1(X_1, \ldots, X_N) = X_1 \text{ OR } X_2 \text{ OR } \ldots \text{ OR } X_N$ (4) $T_1(X_1, \ldots, X_N) = T_1(X_1, \ldots, X_L) \text{ OR } T_1(X_{L+1}, \ldots, X_N)$ (5) $T_2(X_1, \ldots, X_N) = T_2(X_1, \ldots, X_L) \text{ OR } T_2(X_{L+1}, \ldots, X_N) \text{ OR } ( T_1(X_1, \ldots, X_L) \text{ AND } T_1(X_{L+1}, \ldots, X_N) )$ (6) DELAY(N) = 2]($\log_2 N$)[ $-$ 1
WHERE "]x[" MEANS ROUNDING UP TO A NEAREST INTEGER
E.G., ]2[ = 2, ]-2[ = -2, ]1.7[ = 2, ]-1.7[ = -1

FIG. 1

(7) $\quad T_1(X_1,..., X_N) = X_1$ OR ... OR $X_N$ (8) $\quad A_i = X_{i1}$ OR $X_{i2}$ OR ... OR $X_{iN}$ $(1 \leq i \leq M)$ (9) $\quad B_j = X_{1j}$ OR $X_{2j}$ OR ... OR $X_{Mj}$ $(1 \leq j \leq N)$

(10) $\quad T_1(X_{11},..., X_{MN}) = T_1(A_1,..., A_M) = T_1(B_1,..., B_N)$

(11) $\quad T_2(X_{11},..., X_{MN}) = T_2(A_1,..., A_M)$ OR $T_2(B_1,..., B_N)$

(12) $\quad S(T_2(X_{11},..., X_{MN})) \leq M(N-1)+N(M-1)+(3M-4)+(3N-4)+1$

(13) $\quad D(MN) \leq \max(\log_2 M + D(N), \log_2 N + D(M)) + 1$

(14) $\quad S(MN) \leq 2MN - M - N + S(M) + S(N) + 1 - 1$

(15) $\quad D(4) \leq 3\ (=2+1),\quad S(4) \leq 8\ (=2 \times 4)$

(16) $\quad D(16) \leq 6\ (=4+2),\quad S(16) \leq 40\ (=2 \times 16 + 2 \times 4)$

(17) $\quad D(256) \leq 11\ (=8+3),\quad S(256) \leq 560\ (=2 \times 256 + 2 \times 16 + 4 \times 4)$

(18) $\quad D(N) \leq n + k\quad$ (or $n + \log_2 n$)

(19) $\quad S(N) \leq 2 \times 2^{2^k} + 2^{1+2^{k-1}} + 2^{2+2^{k-2}} + 2^{3+2^{k-3}} + ... + 2^{(k-1)+2}$
$\quad\quad\quad = 2N\ \ \ + 2N^{1/2} + 4N^{1/4} + 8N^{1/8} + ... + (n/2) \times 4$

(20) $\quad S(N) \leq 2N + 3.2N^{1/2}$

FIG. 10

| X11 | X12 | X13 | X14 | X15 | X16 | X17 | X18 | X19 | ... |
|-----|-----|-----|-----|-----|-----|-----|-----|-----|-----|
| X21 | X22 | X23 | X24 | X25 | X26 | X27 | X28 | X29 | ... |
| X31 | X32 | X33 | X34 | X35 | X36 | X37 | X38 | X39 | ... |
| X41 | X42 | X43 | X44 | X45 | X46 | X47 | X48 | X49 | ... |
| X51 | X52 | X53 | X54 | X55 | X56 | X57 | X58 | X59 | ... |
| X61 | X62 | X63 | X64 | X65 | X66 | X67 | X68 | X69 | ... |
| X71 | X72 | X73 | X74 | X75 | X76 | X77 | X78 | X79 | ... |
| X81 | X82 | X83 | X84 | X85 | X86 | X87 | X88 | X89 | ... |
| X91 | X92 | X93 | X94 | X95 | X96 | X97 | X98 | X99 | ... |

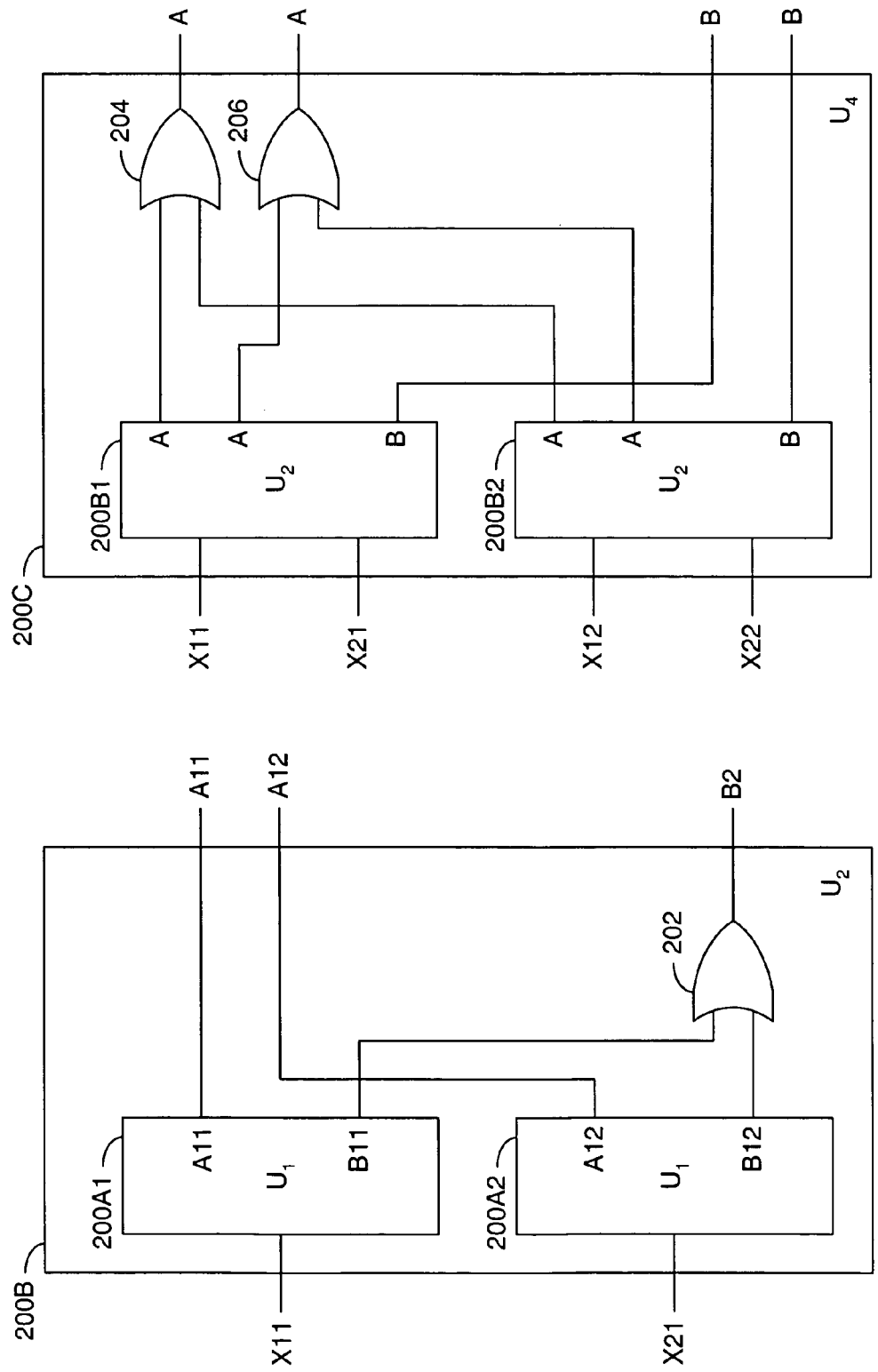

TABLE I
EFFICIENCY

| NUMBER OF INPUTS | DELAY (DEPTH) OLD | DELAY (DEPTH) NEW | NUMBER OF GATES OLD | NUMBER OF GATES NEW |
|---|---|---|---|---|
| 2 | 1 | 1 | 2 | 2 |
| 4 | 3 | 3 | 8 | 8 |
| 8 | 5 | 5 | 20 | 20 |
| 16 | 7 | 6 | 44 | 40 |
| 32 | 9 | 8 | 92 | 80 |
| 64 | 11 | 9 | 188 | 152 |
| 128 | 13 | 10 | 380 | 292 |
| 256 | 15 | 11 | 764 | 560 |
| 512 | 17 | 13 | 1532 | 1096 |
| 1024 | 19 | 14 | 3068 | 2144 |
| $2^n$ | $2n-1$ | $n+\log_2 n$ | $3 \times 2^n - 4$ | $2 \times 2^n + 3.2 \times 2^{n/2}$ (UPPER BOUND) |

FIG. 19

EFFICIENT IMPLEMENTATIONS OF THE THRESHOLD-2 FUNCTION

FIELD OF THE INVENTION

The present invention relates to second monotone symmetric operations generally and, more particularly, to an efficient implementation of a threshold-2 function.

BACKGROUND OF THE INVENTION

A threshold-2 (or second threshold) function (i.e., $T_2$) has practical usage, particularly in content addressable memory (CAM) applications where the second threshold function can be used as part of a multiple match detector. A value generated by a second threshold function indicates whether more than one argument of the function is non-zero. The second threshold function is expressed by equation 1, shown in FIG. 1, where each of $X_1$ through $X_N$ is a binary (i.e., 0 or 1) input argument. In terms of logical AND operations and logical OR operations, the second threshold function in equation 1 is expressed by equation 2, shown in FIG. 1. A standard method of implementation for $T_2$ is based on expansions shown in equations 3 through 5, also shown in FIG. 1. The standard method consists of a hierarchical set of units simultaneously implementing both functions $T_1$ and $T_2$.

Referring to FIG. 2, a block diagram of a conventional 2-input unit 10 is shown. The $Z_2$ unit (or circuit) 10 consists of just two logic gates, a logical OR gate 12 and a logical AND gate 14. Input signals X1 and X2 are applied to each of the logic gates 12 and 14. Output signals T1 and T2 are generated by the logic gates 12 and 14, respectively.

Referring to FIG. 3, a block diagram of a conventional N-input unit 20 is shown. Equations 3 and 4 suggest that a $Z_N$ unit (or circuit) 20 can be implemented using (i) two logical units 22 and 24 and (ii) four logic gates 26, 28, 30 and 32. The logic unit 22 (i.e., $Z_L$ unit) implements both the $T_1$ and the $T_2$ functions for L input signals X1 through XL (i.e., values $X_1$ through $X_L$). The logic unit 24 (i.e., $Z_{N-L}$ unit) implements both the $T_1$ and the $T_2$ functions for the N−L input signals X(L+1) through XN (i.e., values $X_{L+1}$ through $X_N$).

Starting with the $Z_2$ unit and recursively applying the decomposition shown just above can be used to construct $Z_N$ units, for N=4, 8 and 16 inputs, using respectively 2×2+4=8, 2×8+4=20 and 2×20+4=44 logic gates. Generally, 3N−4 logic gates are used in a conventional design, where N is the number of inputs. A delay, measured as maximum number of logic gates along paths from the input signals X1 through XN to the output signals T1 and T2 is one delay time for a $Z_2$ unit, three delay times for a $Z_4$ unit, five delay times for a $Z_8$ unit and seven delay times for a $Z_{16}$ unit. Generally, the delay for the conventional method may be expressed by equation 6, shown in FIG. 1.

Referring to FIG. 4, a block diagram of a conventional 16-input unit 50 is shown. The $Z_{16}$ unit 50 consists of multiple logical OR gates and multiple logical AND gates. The numbers at the inputs and/or outputs to each of the logical gates represent delays from the input signals X1 through X16, assuming that all of the input signals X1 through X16 arrive and/or change simultaneously and no wire delay is taken into consideration. A longest input-to-output path in the $Z_{16}$ unit 50 goes from the input signal X16 to the output signal T2 and has a delay equal to seven. Many of the logic gates have non-synchronous inputs, that is, inputs with (essentially) different signal arrive times.

SUMMARY OF THE INVENTION

The present invention concerns a circuit and a method for operating the circuit. A first step of the method generally comprises generating a plurality of first intermediate signals in two parallel first operations each responsive to a respective half of a plurality of input signals. A second step involves generating a plurality of result signals in a plurality of first logical operations each responsive to at most two of the first intermediate signals. A third step includes generating a first output signal as a particular one of the result signals, wherein a first delay from the first intermediate signals to the first output signal is at most through one logical gate. A fourth step of the method generally comprises generating a second output signal for a second threshold function in a logical OR operation of the result signals except for the particular one result signal.

The objects, features and advantages of the present invention include providing an efficient implementation of a second threshold function that may (i) reduce logical gate delays compared to conventional designs and/or (ii) reduce a number of logical gates compared to a conventional design.

BRIEF DESCRIPTION OF THE DRAWINGS

These and other objects, features and advantages of the present invention will be apparent from the following detailed description and the appended claims and drawings in which:

FIG. 1 is a set of formulae;

FIG. 10 is a set of formulae;

FIG. 13 is a block diagram of an example layout for a 2-input unit;

FIG. 14 is a block diagram of an example layout for a 4-input unit;

FIG. 19 is a table comparing a delay and a number of logic gates for conventional implementations and the present invention.

DETAILED DESCRIPTION OF THE PREFERRED EMBODIMENTS

The present invention generally comprises generating a plurality of first intermediate signals, where a first one of the intermediate signals may represent a value of a function $T_1$. A conjunction of the remaining intermediate values may represent another value of a second threshold function $T_2$. Another step generally involves generating an output signal representing the value of $T_2$. The step of generating the intermediate signals generally contains sub-steps for recursively generating internal intermediate signals similar to the intermediate signals for a respective halves of input signals and combining the internal intermediate signals using 2-input logic gates into the intermediate signals, thus adding a unit of delay.

Figure 2:
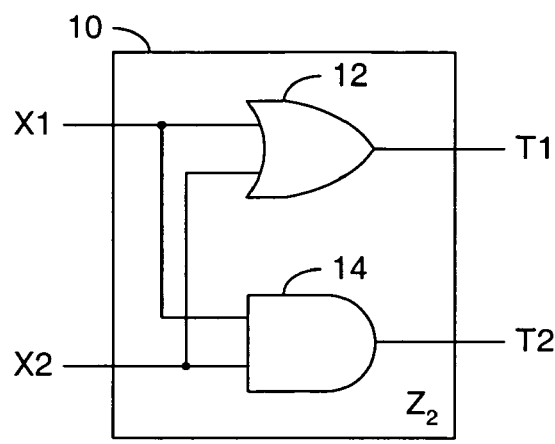
FIG. 2 is a block diagram of a conventional 2-input unit.
Figure 3:
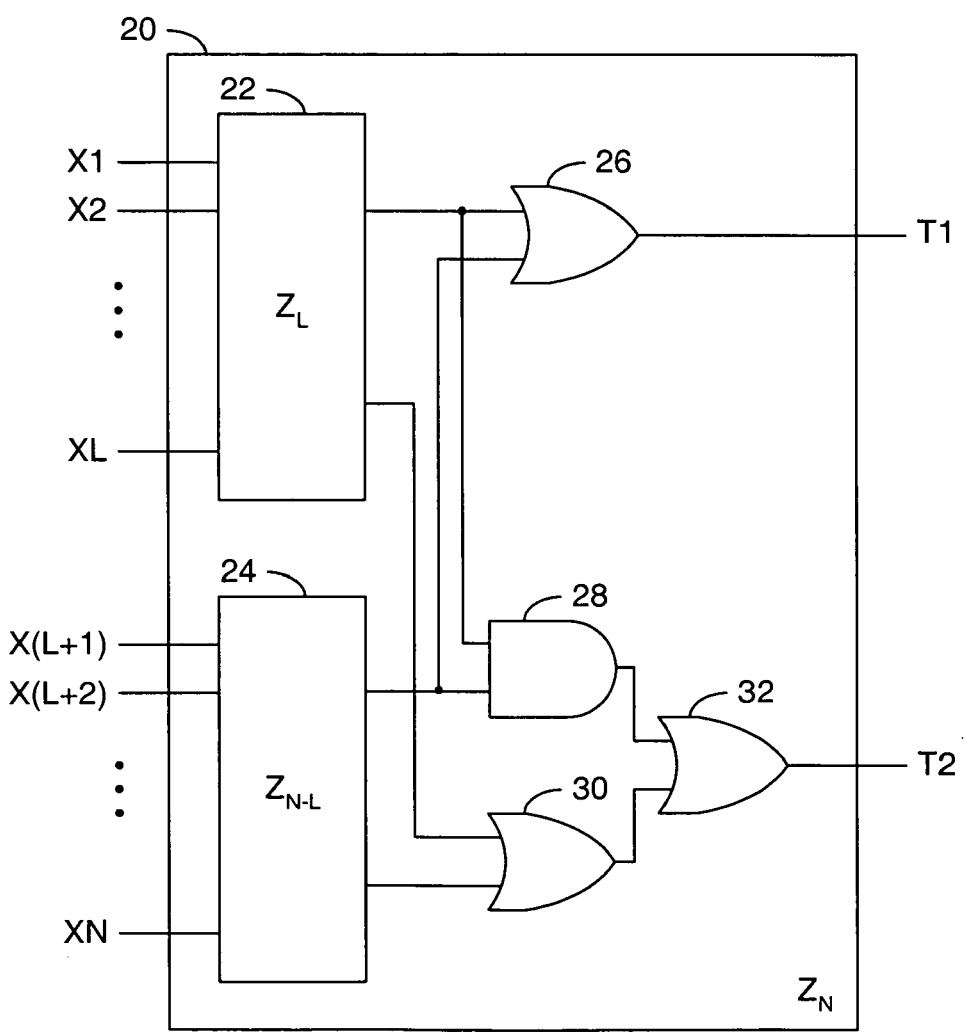
FIG. 3 is a block diagram of a conventional N-input unit.
Figure 4:
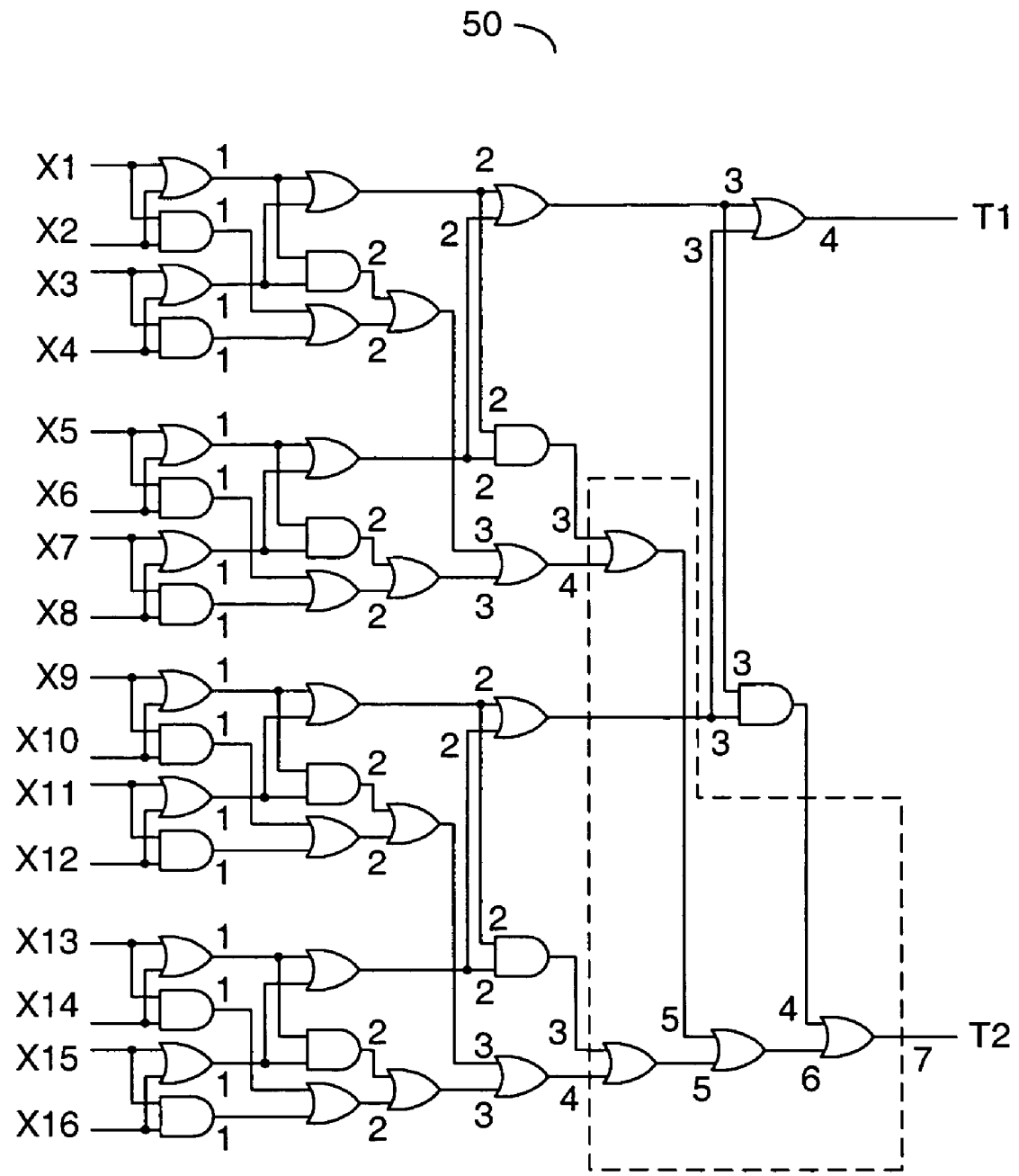
FIG. 4 is a block diagram of a conventional 16-input unit.
Figure 5:
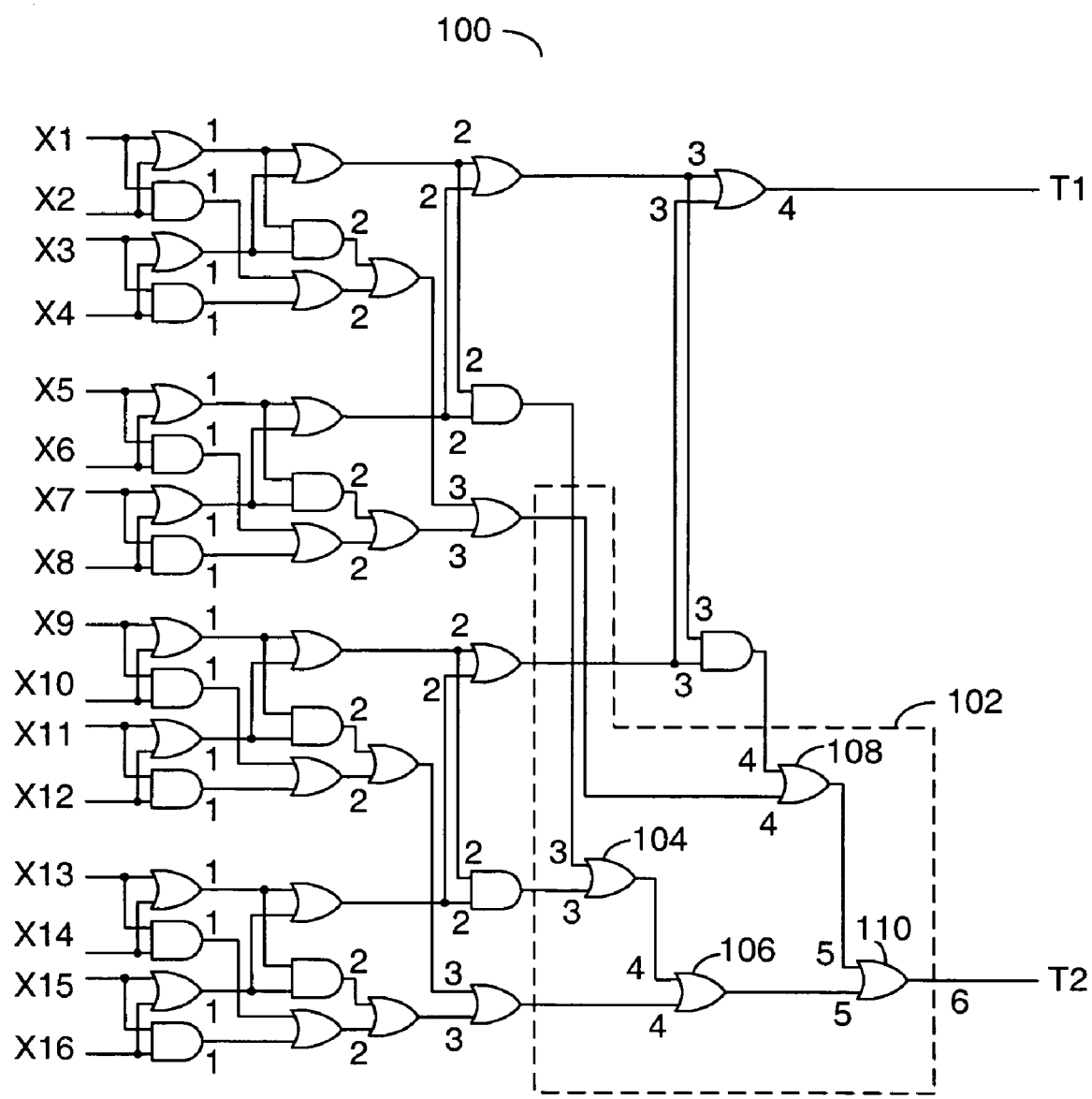
FIG. 5 is a block diagram of an example implementation of a 16-input circuit.

Referring to FIG. 5, a block diagram of an example implementation of a circuit 100 is shown. The circuit (or system) 100 may be operational to implement the second threshold function for N=16 inputs, similar to the $Z_{16}$ unit 50 of FIG. 4. The circuit 100 may generally be implemented in more synchronized way than the $Z_{16}$ unit 50.

The circuit 100 may be distinguished from the $Z_{16}$ unit 50 in that pairs of signals with a least delay may be grouped. One or more logical OR gates may further operate on the grouped signal pairs. The grouped signal pairs may then be replaced by output signals generated by the logic gates. The output signals may be grouped with signals having a next-least delay, and so on. For example, a highlighted part 102 of the circuit 100 generally has five logic gates having inputs with delays of 3, 3, 4, 4 and 4 logic gate delays. A logic gate 104 may combine signals having delays of 3 thus generating a delay of 4. Logic gate 106 and 108 may combine signals having delays of 4 to generate two sets of signals each having a delay of 5. Finally, a logic gate 110 may combine the signals having delays of 5 to generate a signal with a total delay of 6. The delay value of 6 units may be a single delay unit less than as originally illustrated in FIG. 4.

Implementation of a netlist generally having $N=2^n$ inputs (wherein n is an integer) may also be described using an hierarchical construction process. A netlist with the N inputs and 2 outputs may be considered as combination of two major blocks (i) a $Y_N$ module (see FIG. 6) with N inputs and n+1 outputs and (ii) an n-input balanced OR-tree. $Y_2$ modules, $Y_4$ modules, $Y_8$ modules and such, may be designed using of recursive process. The recursive process generally starts from a $Y_2$ module with 2 gates, 2 outputs and depth (delay) equal to 1 (where "1" may represent a number of logic gates from an input to an output and/or a maximum propagation time from the input to the output, with each logic gate generally contributing a unit of propagation time). A $Y_4$ module generally has 2×2+3=7 gates, 3 outputs and a depth (delay) equal to 2 (e.g., a depth of 2 logic gates and/or a propagation time of 2 units). A $Y_8$ module generally has 2×7+4=18 gates, 4 outputs and a depth (delay) equal to 3. A $Y_{16}$ module generally has 2×18+5=41 gates, 5 outputs and a depth (delay) equal to 4, and so on.

Figure 6:
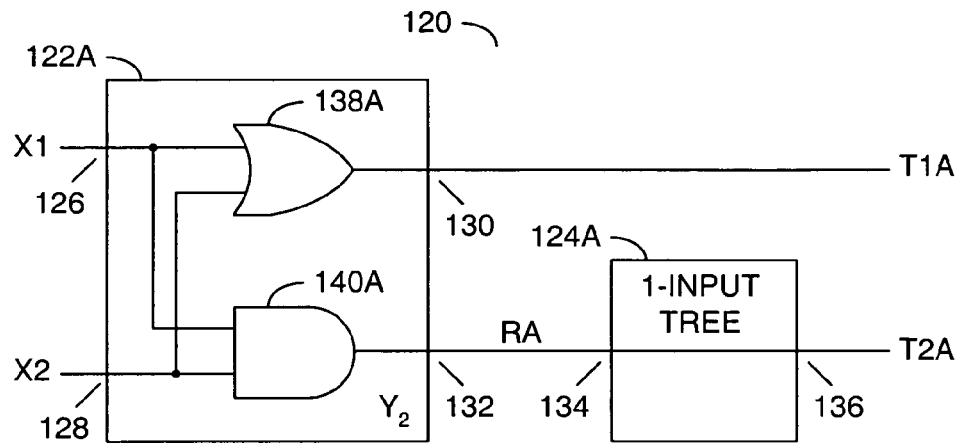
FIG. 6 is a block diagram of an example implementation of a 2-input circuit in accordance with a preferred embodiment of the present invention.

Referring to FIG. 6, a block diagram of an example implementation of a 2-input circuit (or system) 120 is shown in accordance with a preferred embodiment of the present invention. The circuit 120 generally comprises a circuit (or module) 122A and a circuit (or module) 124A. A signal (e.g., X1) may be received at an input 126 of the circuit 122A carrying a value $X_1$. A signal (e.g., X2) may be received at an input 128 of the circuit 122A carrying a value $X_2$. An output 130 of the circuit 122A may present a signal (e.g., T1A) carrying a value $T_{1A}$. An output 132 of the circuit 122A may present a signal (e.g., RA) carrying a value $R_A$ to an input 132 of the circuit 124A. The circuit 124A may have an output 136 to present a signal (e.g., T2A) carrying a value $T_{2A}$. In general, a signal "Xyz" may have a value of $X_{yz}$.

The circuit 120 may be operational to perform a second threshold (threshold-2 or second monotone symmetric) function (or operation) using the two signals X1 and X2 to supply input arguments. The circuit 122A may be referred to as a $Y_2$ module (or unit). The $Y_2$ module 122A may be operational to perform the functions as expressed by equations 2 and 3. The circuit 124A may be referred to as an 1-input tree module. The 1-input tree module 124A may have a simple design in which the signal RA is passed from the input 134 to the output 136 unaltered to present the signal T2A (e.g., T2A=RA).

The $Y_2$ unit 120 generally comprises a logic gate 138A and a logic gate 140A. Both logic gates 138A and 140A may be implemented as two-input logic gates. The logic gate 138A may be operational to perform a logical OR operation of the input signals X1 and X2. The logic gate 140A may be operational to perform a logical AND operation of the input signals X1 and X2. The logical OR gate 138A may present the signal T1A. The logical AND gate 140A may present the signal RA. A propagation delay from a change in one or more of the input signals X1 and X2 to a change in the output signals T1A and T2A may be at most a single delay unit (e.g., the delay through the logical gates 140A and 138A as the 1-input tree module 124A introduces virtually no delay.

The signals T1A and T2A may carry results of a second threshold function. The signal RA may represent an intermediate result from the $Y_2$ module 122A. Each of the signal X1, X2, RA, T1A and T2A may be implemented as a binary logic signal having a boolean one (or true) state and a boolean zero (or false) state. A delay from the input signals X1 and X2 and the output signals T1A and T2A may be at most a single delay unit long.

Figure 7:
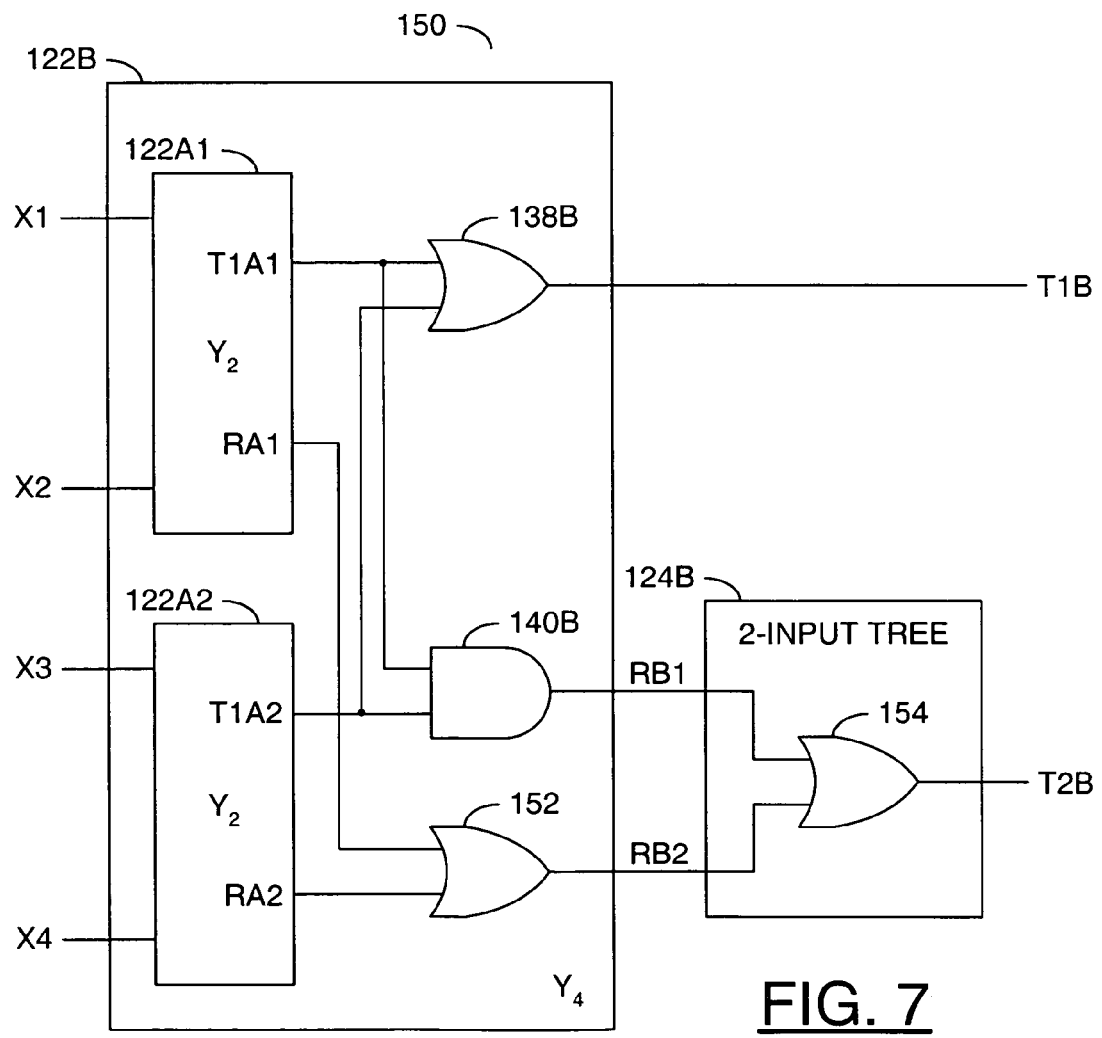
FIG. 7 is a block diagram of an example implementation of a 4-input circuit.

Referring to FIG. 7, a block diagram of an example implementation of a 4-input circuit (or system) 150 is shown. The circuit 150 may be operational to perform a second threshold function using multiple signals (e.g., X1 through X4) to convey input arguments. The circuit 150 generally comprises a circuit (or module) 122B and a circuit (or module) 124B. The input signals X1 through X4 may be received by the module 122B. A first output signal (e.g., T1B) may be generated by the module 122B. A second output signal (e.g., T2B) may be generated by the module 124B. Two result signals (e.g., RB1 and RB2) may be generated by the module 122B and received by the module 124B. The signals T1B and T2B may be representative results of a second threshold function.

The module 122B may be referred to as a $Y_4$ module. The $Y_4$ module generally comprises two of the $Y_2$ modules (e.g., 122A1 and 122A2), a logic gate 138B, a logic gate 140B and a logic gate 152. The logic OR gate 138B may be configured to generate the first output signal T1B by performing a logical OR operation of multiple intermediate signals (e.g., T1A1 and T1A2), similar to the logical OR gate 138A in FIG. 6. The logical AND gate 140B may be configured to generate a result signal (e.g., RA2) by performing a logical AND operation of the intermediate signals T1A1 and T1A2, similar to the logical AND gate 140A in FIG. 6. The logical OR gate 152 may be configured to generate another result signal (e.g., RB2) by performing a logical OR operation of multiple intermediate signals (e.g., RA1 and RA2). A delay from the intermediate signals T1A1 and T1A2 to the first output signal TB1 may be at most a single delay unit long.

The module 124B may be referred to as a 2-input tree module. The 2-input tree module 124B generally comprises a logic gate 154. The logic OR gate 154 may be configured to generate the second output signal T2B by performing a logical OR operation on the result signals RB1 and RB2. A delay from the intermediate signals T1A1 and T1A2 to the second output signal T2B may be at most two delay units long, (i) a first logic gate delay through the parallel logic gates 140B and 152 and (ii) a second logic gate delay through the logic gate 154.

Figure 8:
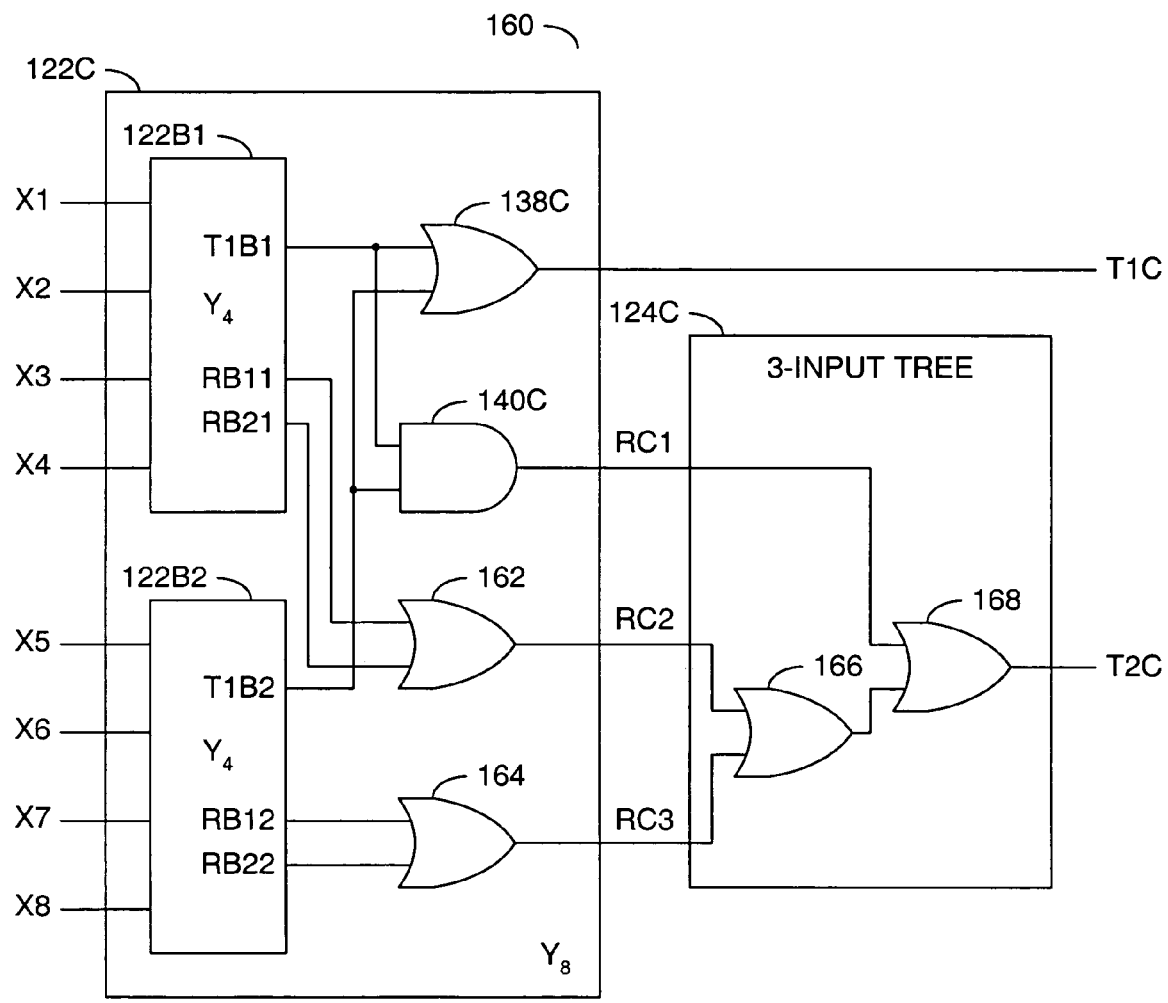
FIG. 8 is a block diagram of an example implementation of an 8-input circuit.

Referring to FIG. 8, a block diagram of an example implementation of a 8-input circuit (or system) 160 is shown. The 8-input circuit 160 may be operational to perform a second threshold function using multiple signals (e.g., X1 through X8) as input arguments. The circuit 160 generally comprises a circuit (or module) 122C and a circuit (or module) 124C. The input signals X1 through X8 may be received by the module 122C. A first output signal (e.g., T1C) may be generated by the module 122C. A second output signal (e.g., T2C) may be generated by the module 124C. Three result signals (e.g., RC1, RC2 and RC3) may be generated by the module 122C and received by the module 124C. The output signals T1C and T2C may be representative results of a second threshold function.

The module 122C may be referred to as a $Y_8$ module. The $Y_8$ module 122C generally comprises two of the $Y_4$ modules (e.g., 122B1 and 122B2), a logic gate 138C, a logic gate 140C, a logic gate 162 and a logic gate 164. The logic gate 138C may be configured to generate the first output signal T1C in response to a logical OR operation of two intermediate signals (e.g., T1B1 and T1B2) received from the $Y_4$ modules, similar to the logic circuit 138B in FIG. 7. The logic gate 140C may be configured to generate the first result signal RC1 in response to a logical AND operation of the two intermediate signals T1B1 and T1B2. The logic gate 162 may be configured to generate intermediate signal RC2 in response to a logical OR operation of two intermediate signals (e.g., RB11 and RB12) received from the $Y_4$ module 122B1. The logic gate 164 may be configured to generate the intermediate signal RC3 in response to a logical OR operation of two intermediate signals (e.g., RB21 and RB22) received from the $Y_4$ module 122B2. A delay from the intermediate signals T1B1 and T1B2 to the first output signal T1C may be at most one delay.

The module 124C may be referred to as a 3-input tree module. The 3-input tree module 124C generally comprises a logic gate 166 and a logic gate 168. The logic gates 166 and 168 may be configured to generate the second output signal T2C by performing a logical OR operation on the result signals RC1, RC2 and RC3. In one embodiment, the 2-input logic OR gates 166 and 168 may be replaced by a single 3-input logic OR gate. A delay from the intermediate signals T1B1, T1B2, RB11, RB12, RB21 and RB22 to the second output signal T2C may be at most three delays.

Figure 9:
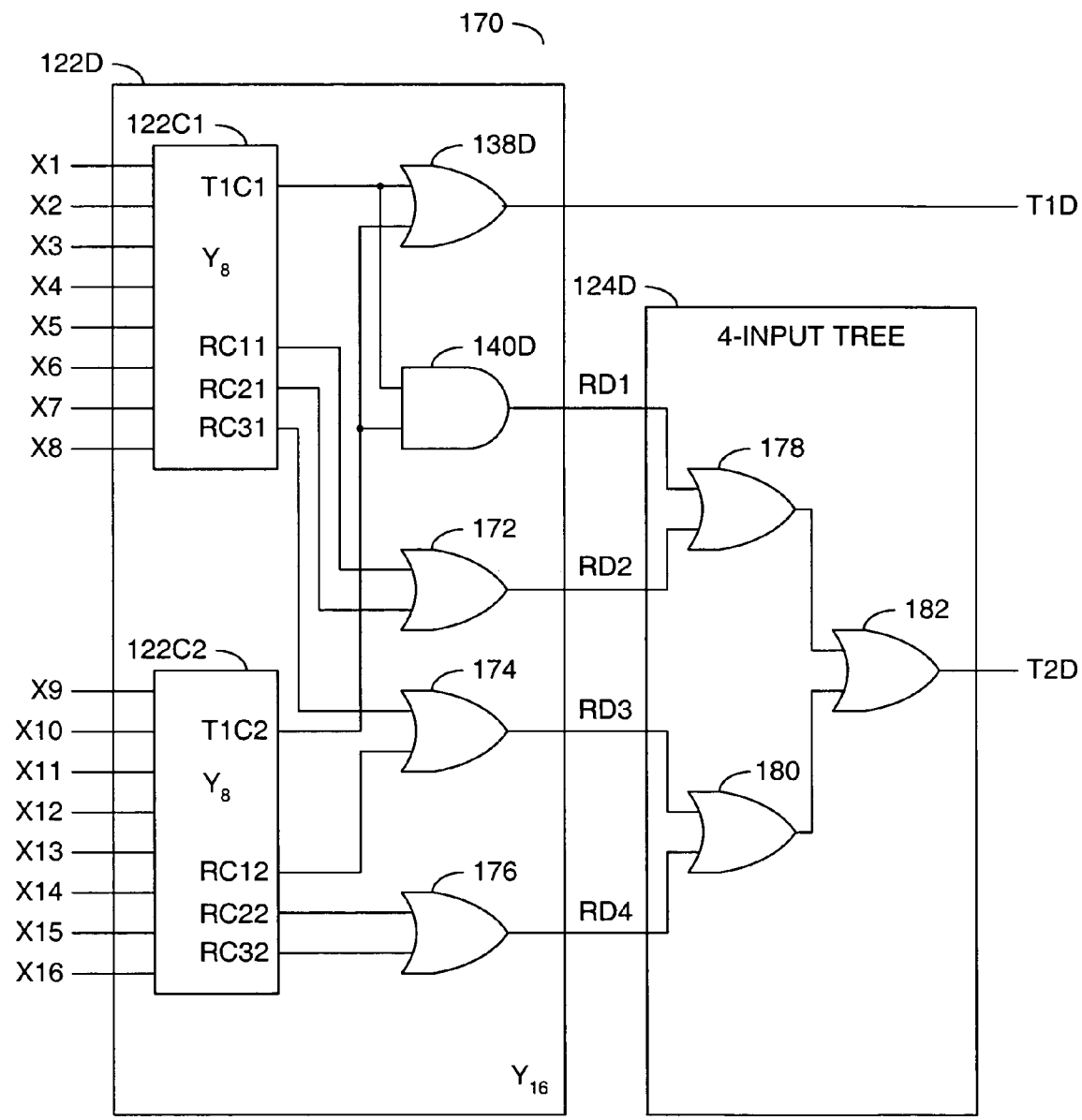
FIG. 9 is a block diagram of an example implementation of a 16-input circuit.

Referring to FIG. 9, a block diagram of an example implementation of a 16-input circuit (or system) 170 is shown. The 16-input circuit 170 may be operational to perform a second threshold function using multiple signals (e.g., X1 through X16) as input arguments. The circuit 170 generally comprises a circuit (or module) 122D and a circuit (or module) 124D. The input signals X1 through X16 may be received by the module 122D. A first output signal (e.g., T1D) may be generated by the module 122D. A second output signal (e.g., T2D) may be generated by the module 124D. Four result signals (e.g., RD1, RCD2, RD3 and RD4) may be generated by the module 122D and received by the module 124D. The output signals T1D and T2D may be representative results of a second threshold function.

The module 122D may be referred to as a $Y_{16}$ module. The $Y_{16}$ module 122D generally comprises two of the $Y_8$ modules (e.g., 122C1 and 122C2), a logic gate 138D, a logic gate 140D, a logic gate 172, a logic gate 174 and a logic gate 176. The logic gate 138D may be configured to generate the first output signal T1D in response to a logical OR operation of two intermediate signals (e.g., T1C1 and T1C2) received from the $Y_8$ modules 122C1 and 122C2. The logic gate 140D may be configured to generate the first result signal RD1 in response to a logical AND operation of the two intermediate signals T1C1 and T1C2. The logic gate 172 may be configured to generate intermediate signal RD2 in response to a logical OR operation of two intermediate signals (e.g., RC11 and RC21) received from the $Y_8$ module 122C1. The logic gate 174 may be configured to generate the intermediate signal RD3 in response to a logical OR operation of an intermediate signal (e.g., RC31) received from the $Y_8$ module 122C1 and an intermediate signal (e.g., RC12) received from the $Y_8$ module 122C2. The logic gate 176 may be configured to generate the intermediate signal RD4 in response to a logical OR operation of two intermediate signals (e.g., RC22 and RB32) received from the $Y_8$ module 122C2. A delay from the intermediate signals T1C1–T1C2 to the first output signal T1D may be at most one delay.

The module 124D may be referred to as a 4-input tree module. The 4-input tree module 124D generally comprises a logic gate 178, a logic gate 180 and a logic gate 182. The logic gates 178, 180 and 182 may be configured to generate the second output signal T2D by performing a logical OR operation on the result signals RD1, RD2, RD3 and RD4. In one embodiment, the 2-input logic OR gates 178, 180 and 182 may be replaced by a single 4-input logic OR gate. A delay from the intermediate signals T1C1, T1C2, RC11, RC12, RC13, RC21, RC22 and RC32 to the second output signal T2D may be at most four logic gate delays.

In general, a $Y_{2k}$ module may be built from two $Y_k$ modules and $2+\lceil \log_2 k \rceil$ extra logic gates (e.g., a logical AND gate and one or more logical OR gates), where $\lceil x \rceil$ generally means rounding up to a nearest integer. The first output signals of both $Y_k$ modules may be connected by a logical OR gate and a logical AND gate to present a first output signal T1 and a first result signal R, respectively. A total of $\lceil \log_2 k \rceil$ additional 2-input logical OR gates may be included in the $Y_{2k}$ module to generate additional results signals from intermediate signals presented by the $Y_k$ modules. Grouping of the intermediate signals (with an exception of the first output signals) may be in any order. Placement consideration generally hint that probably combining geometrically neighboring signals is preferred.

For $N=2^n$, (where n is an integer) a $Y_N$ module may have $3N-n-3$ gates, $n+1$ outputs and a depth (delay) of at most n from the input signals X1 through XN to the second output signal T2. A first (e.g., top) output of the $Y_N$ module generally implements the function $T_1$ whereas the function $T_2$ may be obtained by a logical OR operation of the remaining n outputs. Therefore, computing pair $(T_1, T_2)$ may be accomplished with $3N-n-3+(n-1)=3N-4$ logical gates (the same number of logical gates as for conventional methods), but with maximum depth (depth) of only $n+\log_2 n$ (rounded up), where the term $\log_2 n$ generally reflects the delay through the n-input tree module.

The same depth (delay) may be achieved with about one-third less logic gates by recursively applying an expansion as follows. Considering the function $T_2$ with MN variables $X_{ij}$ marked by pairs of indices, i and j, where $1 \leq i \leq M$ and $1 \leq j \leq N$. Let $A_i$ be expressed by equation 8 and $B_j$ be expressed by equation 9, shown in FIG. 10. Therefore, an expansion in equation 11 generally takes place, and may be directly proven in the following way.

If all variables are zeros, then all $A_i$ and $B_j$ are zeros and the right-hand part in equation 11 also equals zero. If only one variable (e.g., $X_{ij}$) exists with a value of one, then only $A_i$ and $B_j$ will have non-zero values and the right-hand part in equation 11 again equal zero.

Consider a situation having at least two non-zero variables, for example $X_{ij}$ and $X_{pq}$. Equalities i=p and j=q cannot be simultaneously satisfied. If i differs from p, then $A_i$ and $A_p$ are both equal to one and the value of $T_2(A_1, \ldots, A_M)$ equals one. In another case where i=p, then j and q are distinct. Therefore, $B_j$ and $B_q$ are both equal to one and the value of $T_2(B_1, \ldots, B_N)$ equals one. In both cases, the right-hand part in equation 11 equals one, completing the proof of equation 11.

An implementation complexity for the function $T_2$ may be estimated. Using a standard notation: S(C) is the complexity size, number of gates of circuit C, $S_B(T_2)$ is the complexity size, number of gates of the function $T_2$ over basis B (e.g., the complexity of minimal circuit over B implementing $T_2$). If the basis is not explicitly mentioned, assume {AND, OR}.

Using equation 11, an estimation for $S(T_2(X_{11}, \ldots, X_{MN}))$ is generally provided in formula 12, as shown in FIG. 10. Generally, a total gate count of the present invention includes (i) M expressions $A_i$, (ii) N expressions $B_j$, (iii) an M-argument threshold-2 function, (iv) an N-argument threshold-2 function and (v) a disjunction gate (OR), thus giving the estimation shown in formula 12 (the above mentioned conventional design was assumed for parts (iii) and (iv), the gate count for the conventional design of an n-input function $T_2$ equals 3n−4).

In a case M=N and n=NM, a sum in the equation 11 is 2n+o(n). Note that the same is also true for any n, because substitution of a zero value for one variable of an n-argument function $T_2$ also produces an (n−1)-argument function $T_2$ with the complexity decreased. It may be noted that a netlist produced by the above method is generally a best possible one (asymptotically) in the monotone basis {AND, OR} and in the basis B containing all possible 2-input logic gates.

Designing an optimized netlist for MN-input function $T_2$ (actually, for both $T_2$ and $T_1$; if $T_1$ is not utilized, then the gate count may be reduced by 1) generally starts with computing M+N intermediate values using MN variables $X_{ij}$, $1 \leq i \leq M$, $1 \leq j \leq N$, per equations 7 through 11 as shown in FIG. 10. The expansion formulae generally show that a depth D(N) and a size (e.g., number of logic gates) S(N) of netlists computing pair of R-input functions $T_1$ and $T_2$ satisfy inequalities 13 and 14 shown in FIG. 10. The "−1" at the end of inequality 14 may be included because only one of $T_1(A)$ and $T_1(B)$ may be used for computing MN-input function $T_2$, so at least one logic gate may be removed.

Starting with D(2)=1 and S(2)=2, estimations may be made per formulae 15 through 17. In general, for $N=2^n$ (where $n=2^k$) input variables estimations may be expressed by formulae 18 and 19, as shown in FIG. 10. The depth estimation will generally still be the same even if $N=2^n$ is not such that $n=2^k$, S(N) for any $N=2^n$ may be estimated per formula 20.

Figures 11, 12:
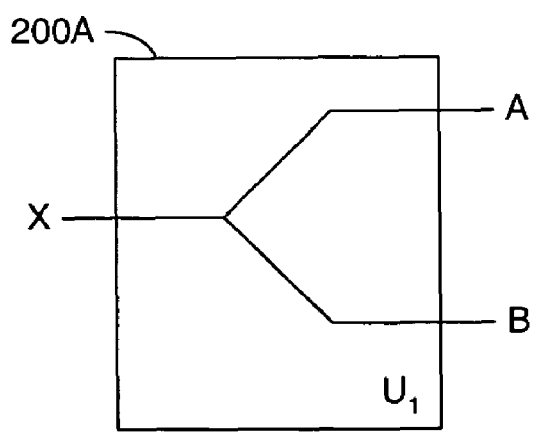
FIG. 11 is a diagram for a grouping of input signals.
FIG. 12 is a block diagram of an example layout for a 1-input unit.

The netlist should have careful placement, because straightforward placement may result in too many long and mutually crossing nets. Note that the valuable parts may be calculations of the intermediate signals Ai and Bj. A better solution may involve recursive grouping of the input signals like as shown in FIG. 11 and creation of the corresponding part of a netlist as a hierarchy of units of the form $U_1$, $U_2$, $U_4$, $U_8$, . . . , where a $U_k$ unit has k=pq inputs and p+q outputs, where p=q or p=2q. For example, the two inputs of a 2-input unit $U_2$ may be considered as if arranged in a column (e.g., X12 and X22). The four inputs of a 4-input unit $U_4$ may be considered as if arranged in a square (e.g., X21, X32, X41 and X42). The eight inputs of an 8-input unit U8 may be considered as if arranged in a rectangle (e.g., X13, X14, X23, X24, X33, X34, X43 and X44), and so on.

Referring to FIG. 12, a block diagram of an example layout for a 1-input unit 200A is shown. FIG. 12 may be applied to each individual variable in FIG. 11. The unit 200A may be referred to as a $U_1$ unit. Layout of the $U_1$ unit 200A may be simple. The $U_1$ unit 200A generally comprises an input signal (e.g., X) and two output signals (e.g., A and B) physically displaced from each other and the input signal X.

Referring to FIG. 13, a block diagram of an example layout for a 2-input unit 200B is shown. FIG. 13 may combine pairs of FIG. 12 for each cell. The unit 200B may be referred to as a $U_2$ unit. The $U_2$ unit 200B generally has 2×1=2 inputs and 2+1=3 outputs. The $U_2$ unit 200B generally comprises two $U_1$ units (e.g., 200A1 and 200A2) and a logic gate 202. The output A11 may be presented by the $U_2$ unit 200B directly from the $U_1$ unit 200A1. The output A12 may be presented by the $U_2$ unit 200B directly from the $U_1$ unit 200A2. The logic gate 202 may generate an output (e.g., B2) in response to a logical OR operation of an output (e.g., B11) from the $U_1$ unit 200A1 and another output (e.g., B12) from the $U_1$ unit 200A2.

Referring to FIG. 14, a block diagram of an example layout of a 4-input unit 200C is shown. The unit 200C may be referred to as a $U_4$ unit. The $U_4$ unit generally comprises two $U_2$ units (e.g., 200B1 and 200B2), a logic gate 204 and a logic gate 206. The $U_4$ unit generally has 2×2=4 inputs and 2+2=4 outputs. The "B" outputs from the $U_2$ units may be directly presented by the $U_4$ unit. Pairs of the "A" outputs from the $U_2$ units may be combined by the logic OR gates 204 and 206.

Figure 15:
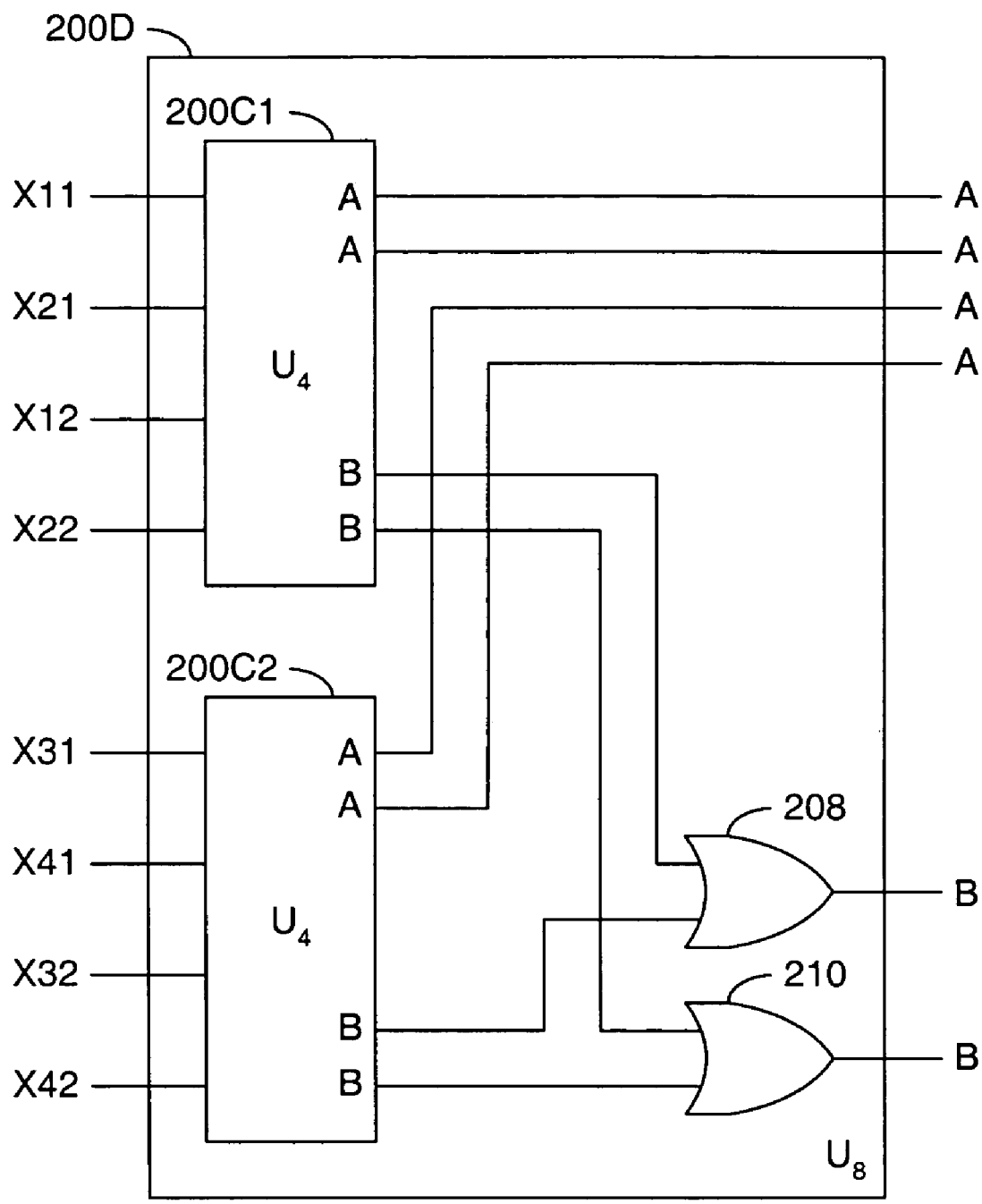
FIG. 15 is a block diagram of an example layout for an 8-input unit.

Referring to FIG. 15, a block diagram of an example layout of an 8-input unit 200D is shown. The unit 200D may be referred to as a $U_8$ unit. The $U_8$ unit generally comprises two $U_4$ units (e.g., 200C1 and 200C2), a logic gate 208 and a logic gate 210. The $U_8$ unit generally has 4×4=16 inputs and 4+2=6 outputs. The "A" outputs from the $U_4$ units may be directly presented by the $U_8$ unit. Pairs of the "B" outputs from the $U_4$ units may be combined by the logic OR gates 208 and 210.

Figure 16:
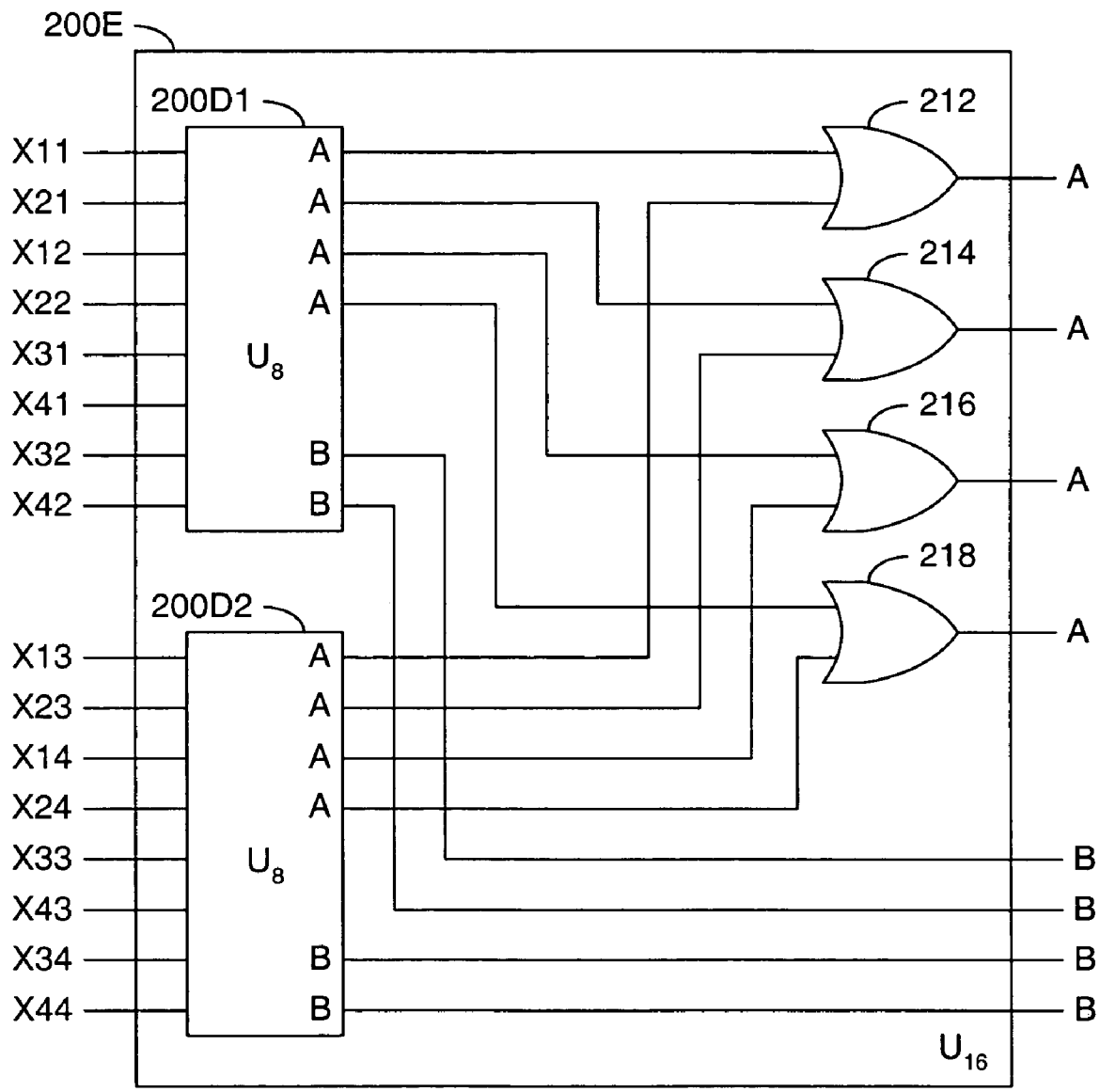
FIG. 16 is a block diagram of an example layout for a 16-input unit.

Referring to FIG. 16, a block diagram of an example layout of a 16-input unit 200E is shown. The unit 200E may be referred to as a $U_{16}$ unit. The $U_{16}$ unit generally comprises two $U_8$ units (e.g., 200D1 and 200D2), a logic gate 212, a logic gate 214, a logic gate 216 and a logic gate 218. The $U_{16}$ unit generally has 2×4×4=16 inputs and 4+4=8 outputs. The "B" outputs from the $U_8$ units may be directly presented by the $U_{16}$ unit unchanged. Pairs of the "A" outputs from the $U_8$ units may be combined by the logic OR gates 212–218.

Larger units may be generated in the same pattern as the above units. In each successive step, (i) logical OR operations may be performed in a first (bottom-top-bottom-top-etc. . . . ) group of outputs of subunits and (ii) a second (top-bottom-top-bottom-etc. . . . ) group may remain untouched.

In the present invention, 2-input logic gates may be replaced (if appropriate and/or improves timing and/or area) by 3-input, 4-input or logic gates with larger fan-in. Using larger inputs logic gates generally results in modifications to the signal groupings by 3, 4, etc., instead of grouping by 2, as shown above.

All netlists proposed above generally use only AND and OR logic gates. Furthermore, almost all (with the exception of a few logic gates near outputs) gates of the netlists are generally such that both inputs have the same depth from the primary inputs. Having the same depth makes possible use of faster and smaller NAND and NOR gates instead of AND and OR gates while adding only a few extra NOT gates and not more than a single unit of delay (actually compensated by the smaller value of the unit). A standard transformation method generally includes:

1) Assign each logic gate to a set called "layer 1", "layer 2", "layer 3", etc.: if a longest path from primary inputs to the output of the logic gate passes through K gates, then the logic gate belongs to the Kth layer.

2) If the input of Kth layer logic gate is driven by an output of Lth layer logic gate, where K−L is an even number, then one buffer (or an odd number R of buffers, where R<K−L) is inserted between the Kth layer logic gate and the Lth layer logic gate.

3) In the same way, if the input of a Kth layer logic gate (where K is even) is driven by a primary input, one buffer (or and odd number R of buffers, where R<K) is inserted between the primary input and the Kth layer logic gate.

4) If outputs of a netlist are driven by logic gates from layers 1, 3, 5, etc., insert an extra buffer before each such output.

5) For layers number 1, 3, 5, etc., replace all AND, OR and BUF logic gates with NAND, NOR, and NOT logic gates, respectively.

6) For layers number 2, 4, 6, etc., replace all AND, OR and BUF logic gates with NOR, NAND and NOT logic gates, respectively.

The present invention may further comprise steps of (i) logically organizing input signals into a two-dimensional grid or matrix, (ii) generating first intermediate signals representing disjunctions (OR) for each row of the matrix, (iii) generating second intermediate signals representing disjunctions (OR) for each column of the matrix, (iv) generating third intermediate signals representing a value of $T_2$ with the first intermediate signals as inputs, (v) generating fourth intermediate signals representing a value of $T_2$ with the second intermediate signals as inputs, (vi) generating an output value by a single OR-gate that takes the third and the fourth intermediate signals as inputs. Sub-steps (iv) and (v) may be implemented recursively applying the same method, or (if there are only a few intermediate inputs) by a conventional method.

Figure 17:
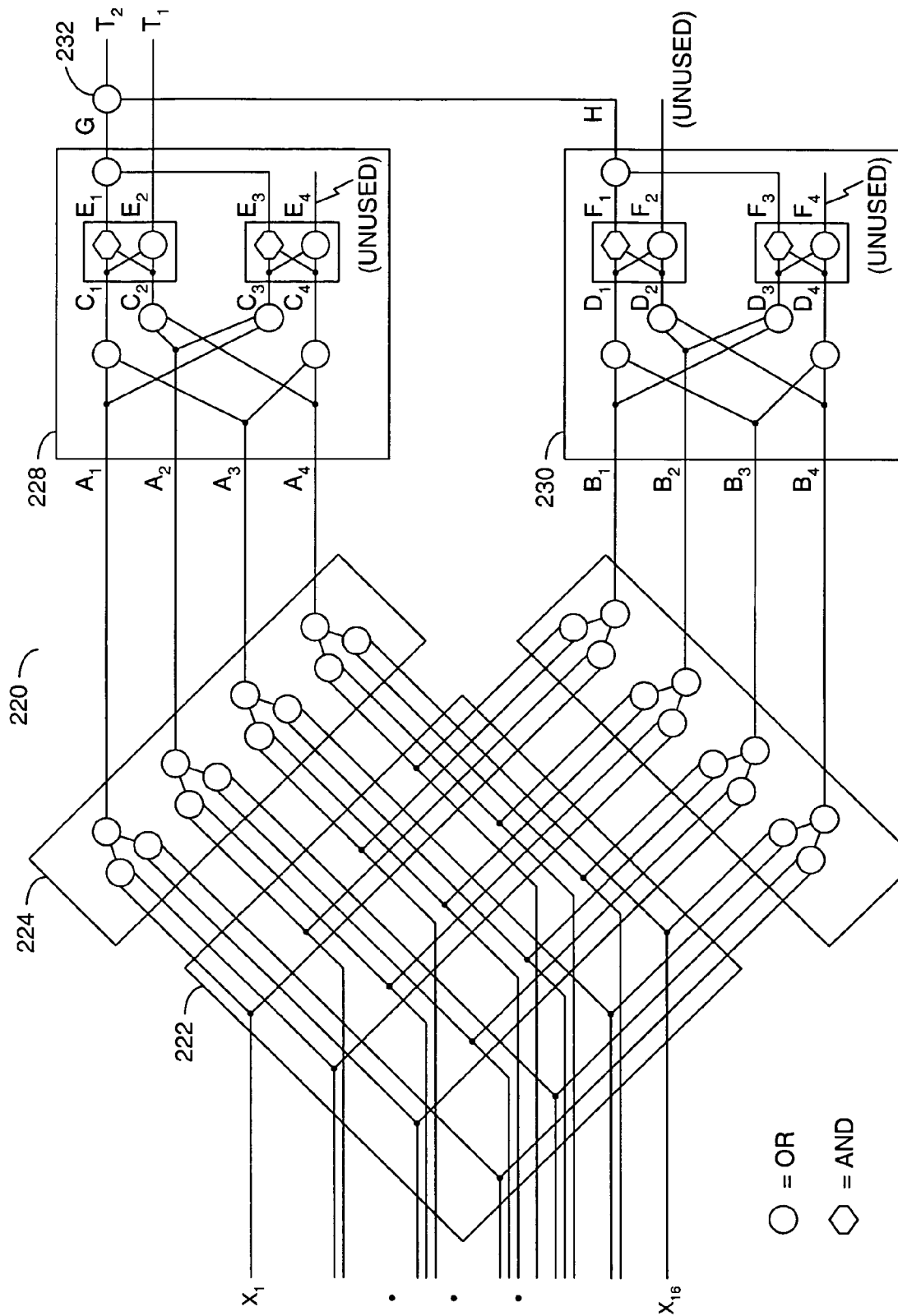
FIG. 17 is a diagram of an example logic structure.

Referring to FIG. 17, a diagram of an example logic structure 220 is shown. The logic structure 220 generally comprises a matrix 222, a block (or module) 224, a block (or module) 226, a block (or module) 228, a block (or module) 230 and a logical OR block (or module) 232. Logical OR operation may be represented in the logic structure 220 by circles, logical AND operation may be represented by hexagons.

The matrix 222 may have multiple (e.g., 16) inputs receiving values (e.g., $X_1$ through $X_{16}$) for the second threshold function $T_2$. Each column and row of the matrix 222 may be connected to one of the blocks 224 and 226. The blocks 224 and 226 may generate first intermediate values (e.g., $A_1$ through $A_4$ and $B_1$ through $B_4$) through multiple logical OR operations on four values received from the matric 222.

Each of the blocks 228 and 230 may be configured to generate second intermediate values (e.g., C1 through C4 and D1 through D4) through multiple logical OR operation on two of the four first intermediate values. Third intermediate value (e.g., $E_1$ through $E_4$ and $F_1$ through $F_4$) may be generated within each of the blocks 228 and 230 using the logic structure of two $Y_2$ modules. In the block 228, the values $E_1$ and $E_3$ may generate a fourth intermediate value (e.g., G) through a logical OR operation. The value $E_2$ may equal the value $T_1$. The value $E_4$ may be unused. In the block 230, the values $F_1$ and $F_3$ may generate a fourth intermediate value (e.g., H) through a logical OR operation. The values $F_2$ and $F_4$ may be unused. The logical OR block 232 may generate the value $T_2$ from the values G and H.

Figure 18:
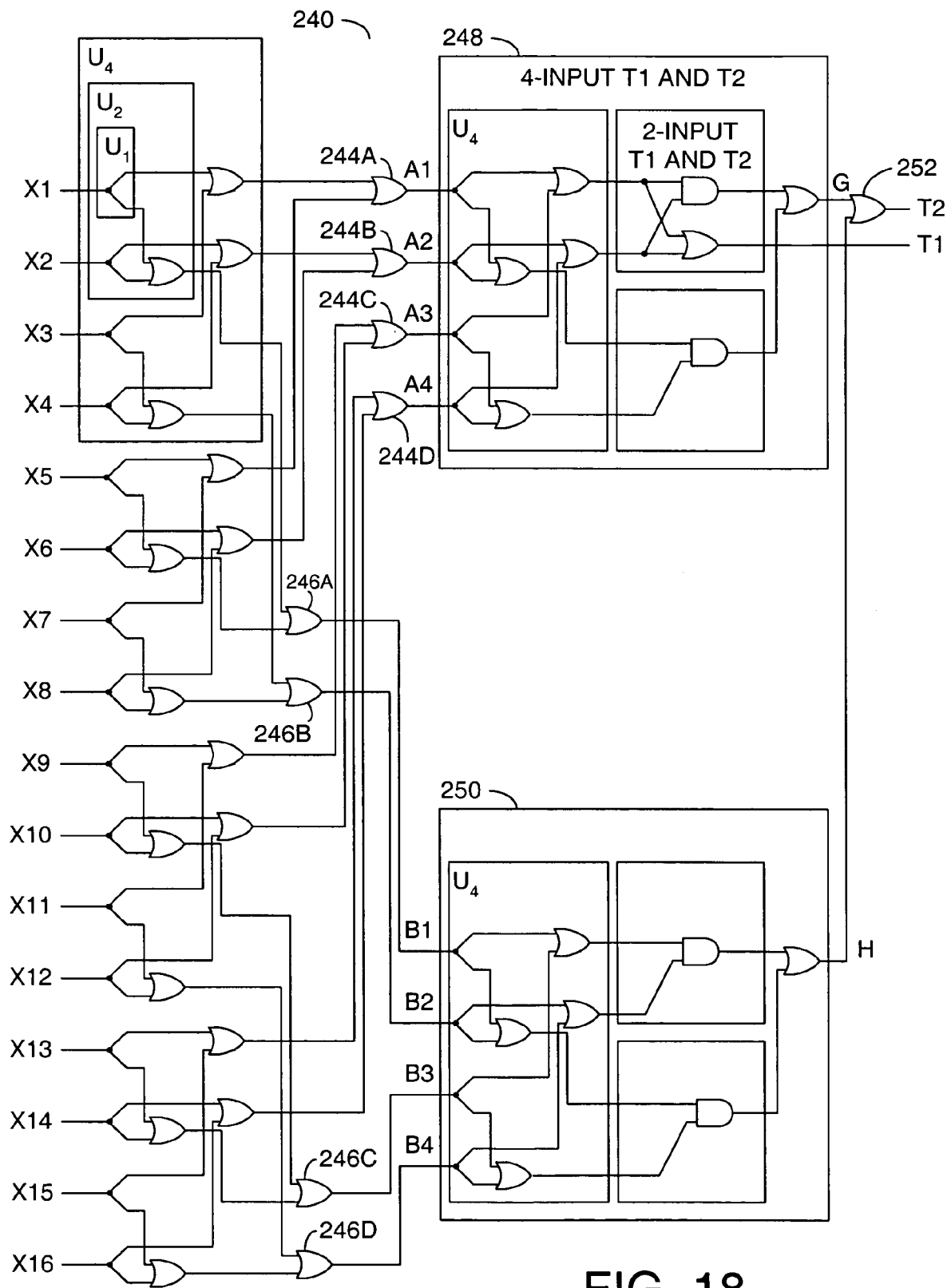
FIG. 18 is a block diagram of an example implementation of another 16-input circuit.

Referring to FIG. 18, a block diagram of an example implementation of a circuit 240 is shown. The circuit 240 may be operational to perform the second threshold function $T_2$ for multiple input signals (e.g., X1 through X16) per the logic structure 220. The matrix 222 of the logic structure 220 may be implemented in the circuit 240 as multiple level of $U_1$, $U_2$ and $U_4$ units. Generation of half of the first intermediate signals (e.g., A1 through A4) may be implemented with logical OR gates 244A–244D. Generation of the remaining intermediate signals (e.g., B1 through B4) may be implemented with logical OR gates 246A–246D.

A circuit (or module) 248 may be implemented with logical OR gates and logical AND gates following the logic structure of the block 228. The circuit 248 may be referred to as a 4-input T1 and T2 circuit. The circuit 248 may be operational to generate a signal (e.g., G).and the signal T1 based on the signals A1 through A4. Logic gates that would otherwise generate unused signals may not be implemented in the circuit 248.

A circuit (or module) 250 may be implemented with logical OR gates and logical AND gates following the logic structure of the block 230. The circuit 250 may be similar to the circuit 248 but without the logic gates that would otherwise generate the signal T1 and the unused signals. A logical OR gate 252 may combine the signal G and and signal (e.g., H) generated by the circuit 250 to generate the signal T2.

Referring to FIG. 19, a table I comparing a delay and a number of logic gates for conventional implementations and the present invention is shown. Table I generally shows delay and depth for simultaneous implementations of $T_2$ and $T_1$; if $T_1$ is not utilized, reduce then numbers in the two last columns by 1. To estimate a quality of the presented method, note that a number of 2-input logic gates for $T_2$ cannot be less than $2 \times 2^n - 3$, and the delay (depth) cannot be less than n (the later is common for any $2^n$-input function that depends on all inputs.)

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for operating a circuit, comprising the steps of:
   (A) generating a plurality of first intermediate signals in two parallel first operations each responsive to a respective half of at least sixteen input signals;

(B) generating a plurality of result signals in a plurality of first logical operations each responsive to at most two of said first intermediate signals, wherein each of said result signals has a similar delay from said input signals;

(C) generating a first output signal as a particular one of said result signals, wherein a first delay from said first intermediate signals to said first output signal is at most through one logical gate; and (D) generating a second output signal for a threshold-2 function in a logical OR operation of all of said result signals except for said particular one result signal.

2. The method according to claim 1, wherein each of said first operations comprises the sub-step of:
generating a plurality of second intermediate signals in four parallel second operations each responsive to a respective quarter of said input signals, wherein a second delay from said second intermediate signals to said first output signal is at most through two sequential logic gates.

3. The method according to claim 2, wherein each of said first operations further comprises the sub-step of:
generating said first intermediate signals in a plurality of second logical operations each responsive to at most two of said second intermediate signals.

4. The method according to claim 3, wherein each of said second operations comprises the step of:
generating a plurality of third intermediate signals in eight parallel third operations each responsive to a respective eighth of said input signals, wherein a third delay from said third intermediate signals to said first output signal is at most through three sequential logic gates.

5. The method according to claim 4, wherein each of said second operations further comprises the step of:
generating said second intermediate signals in a plurality of third logical operations each responsive to at most two of said third intermediate signals.

6. The method according to claim 5, wherein a total delay from said input signals to said first output signal is at most through four sequential logic gates.

7. The method according to claim 1, wherein step (D) comprises the sub-step of:
generating a plurality of internal signals in a plurality of initial logical OR operations of said result signals except for said particular one result signal.

8. The method according to claim 1, wherein a maximum delay from said input signals to said second output signal is at most through n+log2n sequential logic gates, where $2^n$ is a number of said input signals.

9. A method for operating a circuit, comprising the steps of:
(A) generating a plurality of first intermediate signals in two parallel first operations each responsive to a respective half of a plurality of input signals;

(B) generating a plurality of result signals in a plurality of first logical operations each responsive to at most two of said first intermediate signals;

(C) generating a first output signal as a particular one of said result signals, wherein a first delay from said first intermediate signals to said first output signal is at most through one logical gate; and (D) generating a second output signal for a second threshold function in a logical OR operation of said result signals except for said particular one result signal, wherein step (D) comprises the sub-steps of (i) generating a plurality of internal signals in a plurality of initial logical OR operations of said result signals except for said particular one result signal and (ii) generating said second output signal by a final logical OR operation of said internal signals.

10. A circuit comprising:
two first modules operating in parallel and each configured to generate a respective half of a plurality of first intermediate signals in response to a respective half of at least sixteen input signals;
a plurality of first logic gates configured to generate a plurality of results signals in response to said first intermediate signals, wherein (i) a particular one of said results signals represents a first output signal, (ii) a first delay from said first intermediate signals to said first output signal is at most through one logic gate and (iii) each of said result signals has a similar delay from said input signals; and
a tree module configured to generate a second output signal of a threshold-2 function in a logical OR operation of all of said result signals except for said particular one result signal.

11. The circuit according to claim 10, wherein each of said first modules comprises two second modules operating in parallel and each of said second modules is configured to generate a respective quarter of a plurality of second intermediate signals in response to a respective quarter of said input signals, wherein a second delay from said second intermediate signals to said first output signal is at most through two sequential logical gates.

12. The circuit according to claim 11, where each of said first modules further comprises a plurality of second logic gates each configured to generate a respective one of said first intermediate signals in response to at most two of said second intermediate signals.

13. The circuit according to claim 12, wherein each of said second modules comprises two third modules operating in parallel and each configured to generate a respective eighth of a plurality of third intermediate signals in response to a respective eighth of said input signals, wherein a third delay from said third intermediate signals to said first output signal is at most through three sequential logical gates.

14. The circuit according to claim 13, where each of said second modules further comprises a plurality of third logic gates each configured to generate a respective one of said second intermediate signals in response to at most two of said third intermediate signals.

15. The circuit according to claim 14, wherein a total delay from said input signals to said first output signal is at most through four sequential logic gates.

16. The circuit according to claim 10, wherein said first logical gates comprise (i) at most one logical AND gate and (ii) a plurality of logical OR gates.

17. The circuit according to claim 10, further comprising a plurality of traces adjacent each other and carrying said first intermediate signals, wherein an outer one of said traces carries said particular one first intermediate signal.

18. The circuit according to claim 10, wherein said tree module is further configured to (i) generate a plurality of internal signals in a plurality of initial logical OR operations of said result signals except for said particular one result signal and (iii) generate said second output signal by a final logical OR operation of said internal signals.

19. A circuit comprising:
N binary inputs, where N is at least sixteen; and
a plurality of two-input logic gates configured to perform a threshold-2 function for said N binary inputs, wherein a total number of said two-input logic gates is at most $2N+3.2 \times N^{1/2}$.

20. The circuit according to claim 19, wherein said N binary inputs comprises 16 inputs and said total number of said two-input logic gates is less than 44.

21. The circuit according to claim 19, wherein said N binary inputs, comprises 1024 inputs and said total number of said two-input logic gates is less than 3068.

22. The circuit according to claim 19, wherein a maximum delay from said N binary inputs to an output of said threshold-2 function is at most through $n+\log 2n$ sequential logic gates, where $2^n$ is a number of said N binary inputs.

* * * * *